United States Patent
Hallen

(10) Patent No.: US 6,292,056 B1
(45) Date of Patent: Sep. 18, 2001

(54) DIFFERENTIAL AMPLIFIER WITH ADJUSTABLE COMMON MODE OUTPUT VOLTAGE

(75) Inventor: Thor Hallen, Beaverton, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/611,357

(22) Filed: Jul. 6, 2000

(51) Int. Cl.[7] .................................................... H03F 3/45
(52) U.S. Cl. ........................... 330/258; 330/252; 330/261
(58) Field of Search .................................. 330/252, 258, 330/261, 256

(56) References Cited

U.S. PATENT DOCUMENTS

| | | | |
|---|---|---|---|
| 4,560,947 | * | 12/1985 | Frey ...................................... 330/254 |
| 4,904,953 | * | 2/1990 | McCormack ........................... 330/258 |
| 5,283,535 | * | 2/1994 | Sevenhans et al. .................... 330/258 |
| 5,412,343 | * | 5/1995 | Rijns ...................................... 330/258 |

FOREIGN PATENT DOCUMENTS 9-153747-A * 6/1997 (JP).

* cited by examiner

Primary Examiner—Robert Pascal
Assistant Examiner—Patricia T. Nguyen
(74) Attorney, Agent, or Firm—Daniel J. Bedell; Smith-Hill and Bedell

(57) ABSTRACT

A control unit automatically adjusts the supply voltage to a differential amplifier so that the amplifier has a common mode output voltage matching an input control voltage. The control unit employs circuit elements analogous to circuit elements forming the differential amplifier to generate a reference voltage in response to the supply voltage wherein the reference voltage is an estimate of the amplifier's common mode output voltage. An operational amplifier receiving the control voltage and the reference voltage as inputs, adjusts the supply voltage so the reference voltage matches the control voltage, thereby ensuring that the amplifier's common mode output voltage matches the control voltage.

19 Claims, 3 Drawing Sheets

US 6,292,056 B1

DIFFERENTIAL AMPLIFIER WITH ADJUSTABLE COMMON MODE OUTPUT VOLTAGE

BACKGROUND OF THE INVENTION

1. Field of the Invention

The present invention relates in general to differential amplifiers and in particular to a differential amplifier having an adjustable common mode output voltage.

2. Description of Related Art

Figure 1:
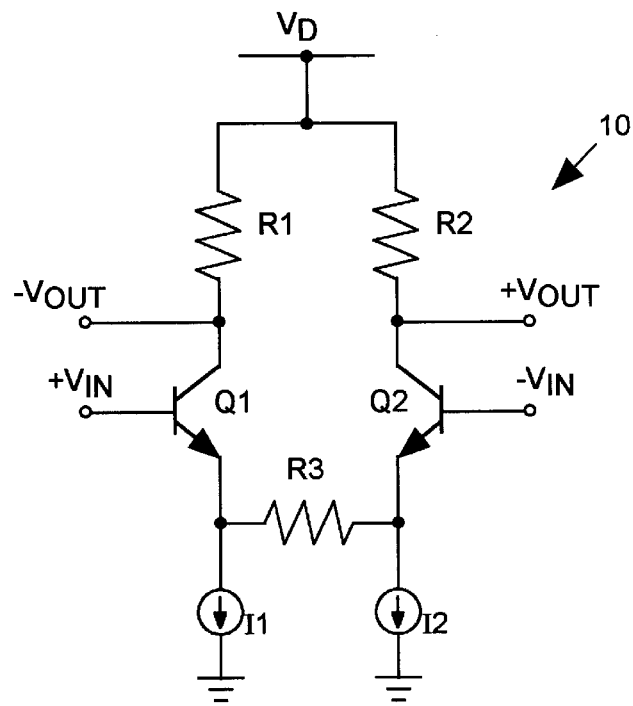

FIG. 1 illustrates in schematic diagram form a typical prior art differential amplifier 10 including a pair of transistors Q1 and Q2, a pair of matching load resistors R1 and R2 linking collectors of transistors Q1 and Q2 to a voltage source $V_D$, a pair of matching current sources I1 and I2 supplying emitter current to transistors Q1 and Q2, and a resistor R3 connected between the emitters of transistors Q1 and Q2. Amplifier 10 amplifies an input signal $V_{IN}$ applied across the bases of transistors Q1 and Q2 to produce an output signal $V_{OUT}$ across the collectors of transistors Q1 and Q2.

The common mode output voltage of a differential amplifier is defined as the average voltage at its differential output terminals. For the amplifier 10 the common mode voltage $V_{CM}$ is a function of a load current and a resistance as follows:

$$V_{CM} = V_D - I_L R_L$$

where load current $I_L = I1 = I2$ and load resistance $R_L = R1 = R2$.

In many applications it is desirable to precisely set the common mode output voltage of a DC-coupled differential amplifier. From the above equation we can see that we can choose the common mode voltage by appropriately adjusting the values of load resistors R1 and R2, the magnitude of load currents I1 and I2 and the magnitude of supply voltage $V_D$. Thus when we design a differential amplifier we choose the values of load resistors R1 and R2 and load currents I1 and I2 in part to set the desired common mode voltage. However since process variations cause the actual resistance of resistors or current output of current sources to vary somewhat from their nominal values, the actual common mode voltage will vary somewhat from the design value. Load resistors R1 and R2 have been implemented using adjustable resistors, such as for example potentiometers or laser-trimmable resistors, when a more precise control over common mode voltage has been needed. The resistance of the load resistors can then be iteratively adjusted while measuring the actual common mode output voltage so as to more precisely set the common mode voltage to a desired level. similarly when current sources I1 and I2 are adjustable or when voltage source $V_D$ is adjustable, we can iteratively adjust the current produced by current sources I1 and I2 or iteratively adjust the voltage source until we obtain the desired common mode voltage.

However it is inconvenient and time-consuming to measure the common mode output voltage of a differential amplifier while iteratively adjusting its load current, load resistance or supply voltage. And even though we can precisely adjust an amplifier's common mode output voltage by such methods, we cannot be certain that the amplifier's common mode output voltage will stay where we set it. The resistance of the load resistors R1 and R2, and the current produced by current sources I1 and I2, and the source voltage $V_D$ produced by many power supplies are temperature-dependent. Thus when the temperature of amplifier 10 changes, so too does its common mode output voltage.

What is needed is a differential amplifier having a common mode output voltage that can be conveniently and accurately adjusted to a desired level that is stable irrespective of process and temperature variations.

SUMMARY OF THE INVENTION

In accordance with the invention, a control unit automatically adjusts the supply voltage to a differential amplifier so that the amplifier has a common mode output voltage matching a control voltage supplied as input to the control unit.

The control unit includes a reference circuit for generating a reference voltage in response to the supply voltage, wherein the reference voltage substantially matches the common mode output voltage of the differential amplifier. The control unit also includes an operational amplifier for receiving the control voltage and the reference voltage as inputs and for adjusting the supply voltage so that the reference voltage matches the control voltage, thereby ensuring that the amplifier's common mode output voltage substantially matches the control voltage.

It is accordingly an object of the invention to provide a means for setting the common mode output voltage of a differential amplifier to a desired level.

It is a further object of the invention to provide a means for maintaining the common mode output voltage of a differential amplifier to that desired level despite variations in temperature of the differential amplifier.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
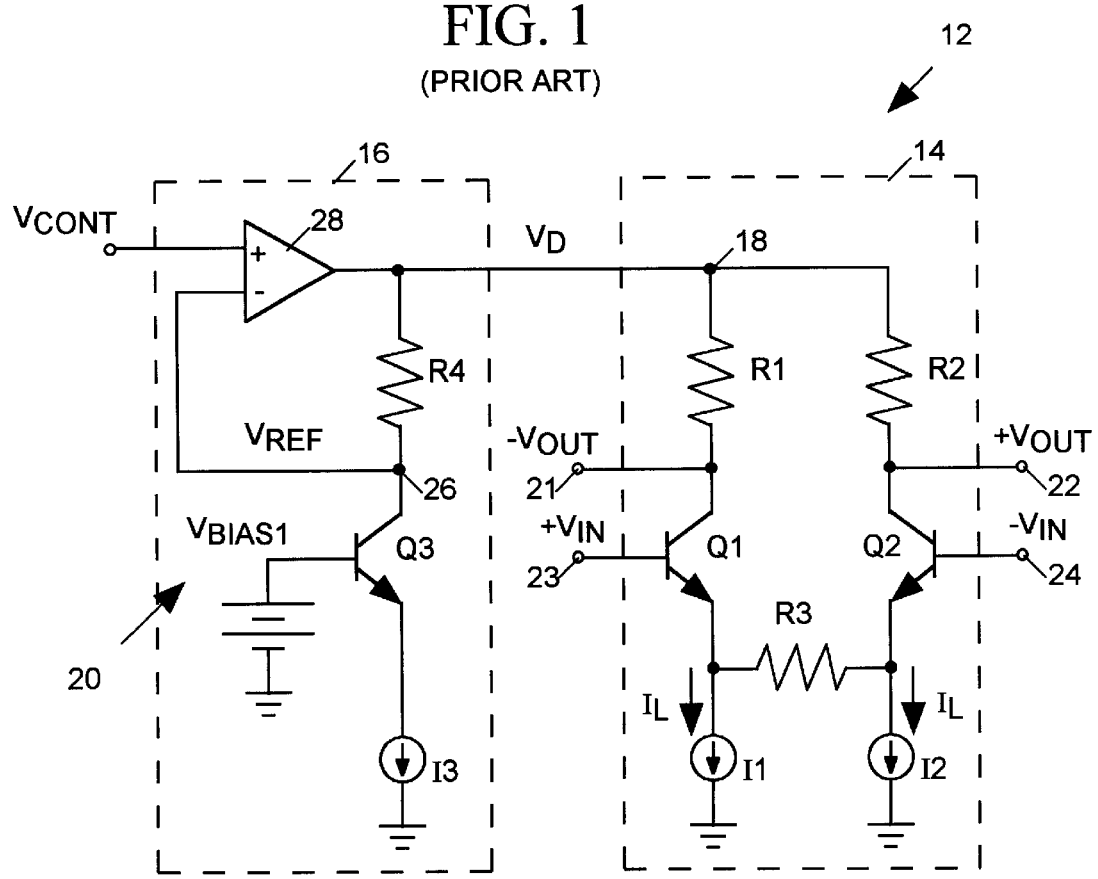
Figure 3:
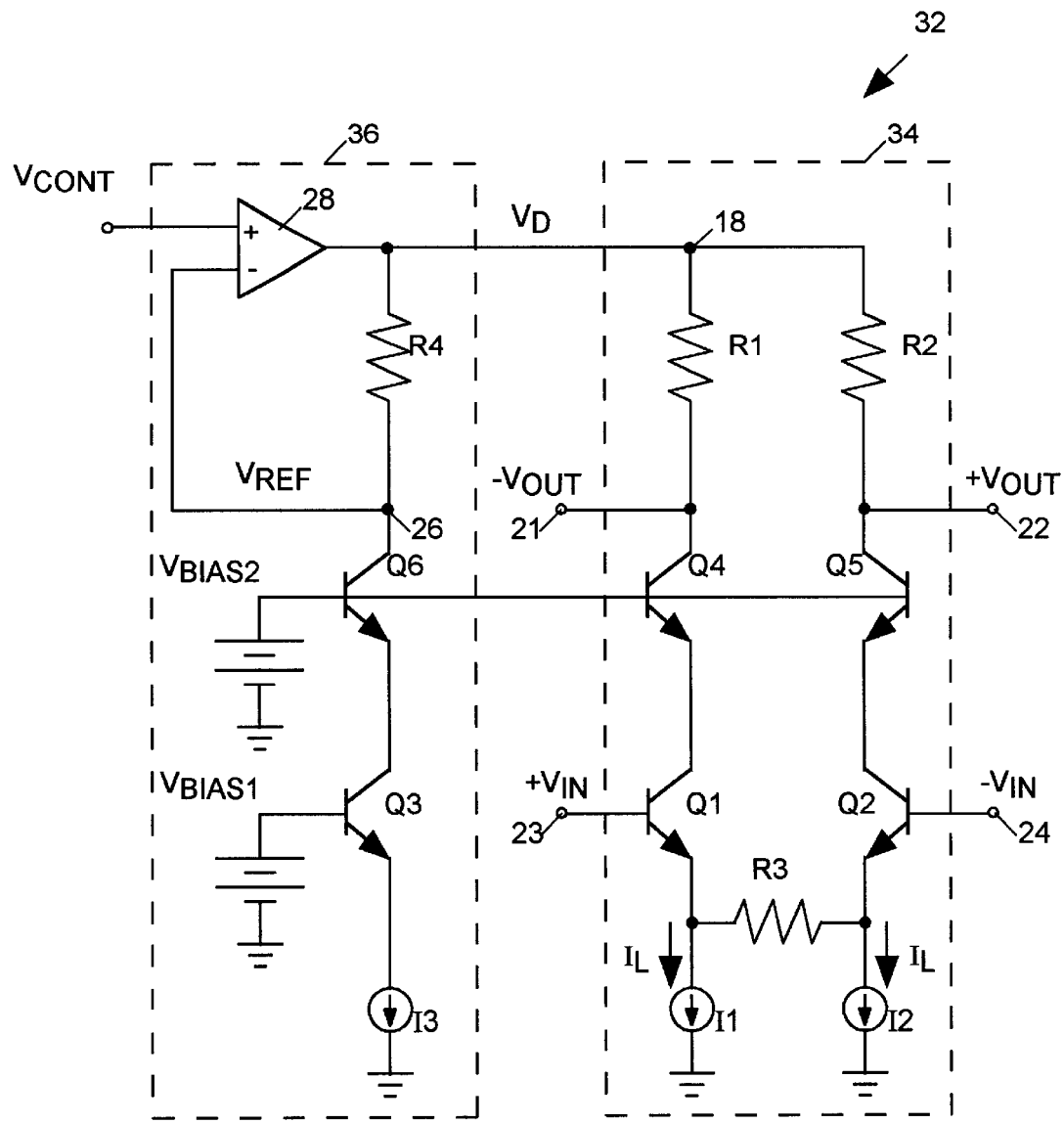
Figure 4:
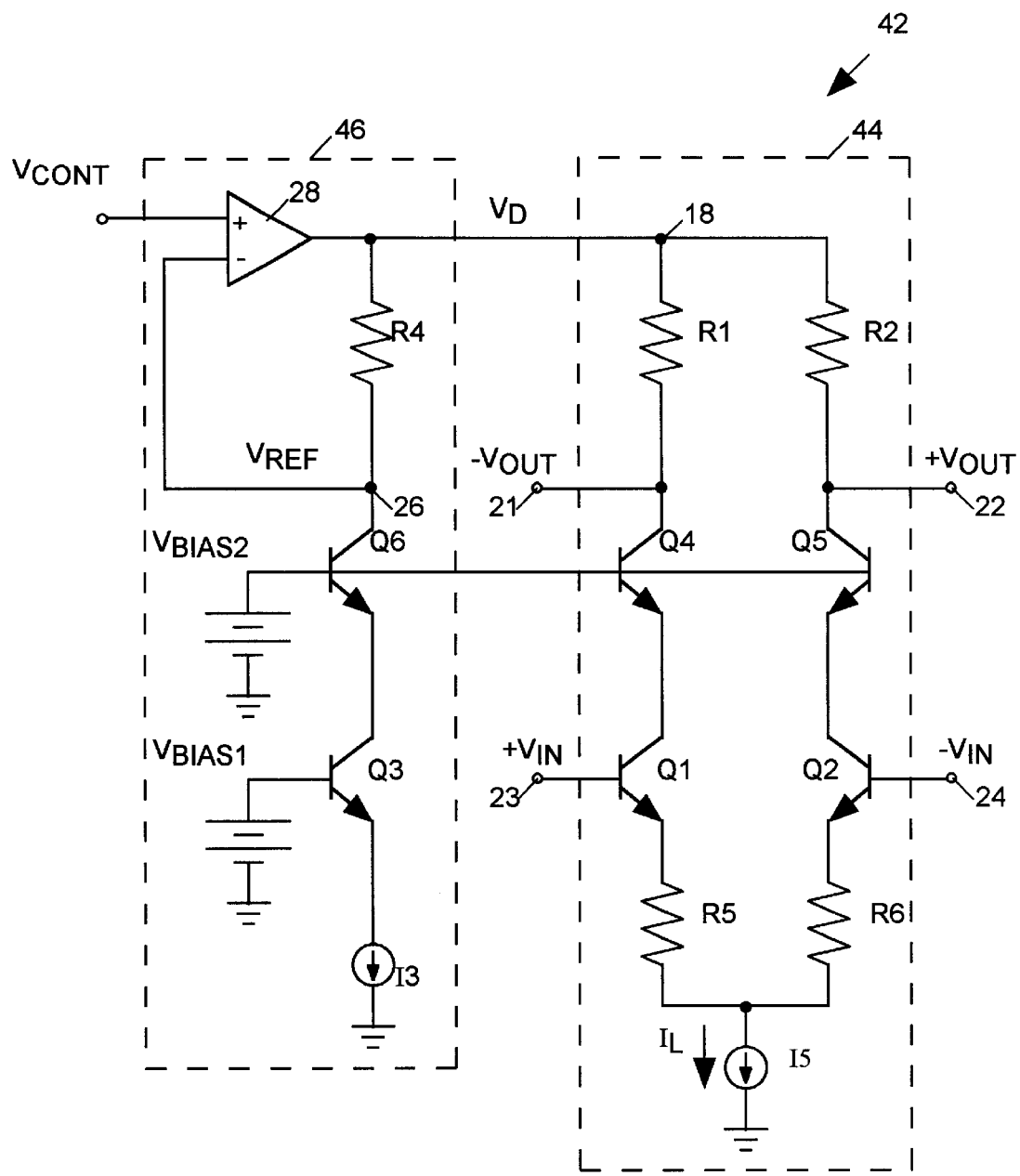

FIG. 1 illustrates a typical prior art differential amplifier in schematic diagram form; and FIGS. 2–4 illustrate in schematic diagram form alternative embodiments of a differential amplifier in accordance with the invention having an adjustable common mode output voltage.

DESCRIPTION OF THE PREFERRED EMBODIMENT(S)

FIG. 2 illustrates in schematic diagram form a differential amplifier 12 in accordance with the invention having an adjustable common mode output voltage. Amplifier 12 consists of a conventional differential amplifier 14 and a common mode output voltage control unit 16. Amplifier 14 includes a pair of matching load resistors R1 and R2 connected between a supply node 18 and the amplifier's differential output terminals 21 and 22 at the collectors of a pair of transistors Q1 and Q2. The bases of transistors Q1 and Q2 are connected to the amplifier's differential input terminals 23 and 24.

Amplifier 14 amplifies a differential input signal $V_{IN}$ applied across input terminals 23 and 24 to produce a differential output signal $V_{OUT}$ across output terminals 21 and 22. The common mode output voltage $V_{CM}$ of differential amplifier 14 is defined as the average voltage at its differential output terminals. For amplifier 14 the common mode voltage $V_{CM}$, is a function of the supply voltage $V_D$ at node 18, a load current $I_L$ and a load resistance $R_L$ as follows:

$$V_{CM} = V_D - I_L R_L \quad [1]$$

where load current $I_L = I1 = I2$ and load resistance $R_L = R_1 =$

In many applications it is necessary to precisely set the common mode output voltage of a DC-coupled differential amplifier. As we can see from equation [1], we can adjust $V_{cm}$ by adjusting $V_D$. However since process variations cause the actual resistance of resistors R1 and R2 and the output of current sources I1 and I2 to vary somewhat, the actual common mode voltage $V_{CM}$ can vary somewhat from their nominal design values. Thus setting $V_D$ to a value expected to produce a desired common mode output voltage $V_{vm}$ based on the nominal design values of $I_L$ and $R_L$ will not necessarily produce the desired common mode output voltage. Also since the value of $R_L$ and $I_L$ are temperature-dependent, setting $V_D$ to a fixed value renders $V_{CM}$ temperature-dependent.

In accordance with the present invention, control unit automatically adjusts the supply voltage $V_D$ at node 18 so that the common mode output voltage $V_{CM}$ is equal to an input control voltage $V_{CONT}$ irrespective of process and temperature-dependent variations in $R_L$ or $I_L$.

Control unit 16 includes a reference circuit 20 that generate a reference voltage $V_{REF}$ in response to supply voltage $V_D$ that is substantially equal to the common mode output voltage of amplifier 28. An operational amplifier 28 amplifies a difference between $V_{CONT}$ and reference voltage $V_{REF}$ to produce the supply voltage $V_D$ at supply node 18. Responding to the feedback provided by reference circuit 20, amplifier 28 automatically adjusts $V_D$ SO that $V_{REF}$ substantially matches $V_{CONT}$, thereby ensuring that the common mode output voltage $V_{CM}$ of differential amplifier 28 matches $V_{CONT}$.

Reference circuit 20 includes a reference resistor R4, a reference transistor Q3, and a reference current source I3. Resistor R4 is connected between supply node 18 and a reference node 26 at the collector of transistor Q3. A fixed bias voltage $V_{BIAS1}$ is applied to the base of transistor Q3, and reference current source I3 supplies current to the emitter of transistor Q3.

Assume reference current source I3 is similar to current sources I1 and I2, that reference resistor R4 is similar to resistors R1 and R2, that reference transistor Q3 is similar to transistors Q1 and Q2, and that amplifier 14 and control unit 12 are implemented on a single integrated circuit so that all transistors, resistors and current sources are subject to substantially the same temperature variations. In such case current source I3 will provide the same load current $I_L$ as current sources I1 and I2, the reference voltage $V_{REF}$ appearing at node 26 will substantially match the common mode output voltage $V_{CM}$ of amplifier 14, and operational amplifier 28 will drive $V_D$ to a level sufficient to make the reference voltage $V_{REF}$ at node 26 match its control voltage input $V_{CONT}$ col. In doing so the control unit 16 automatically adjusts supply voltage $V_D$ SO that the common mode output voltage $V_{CM}$ of amplifier 14 substantially matches $V_{CONT}$ regardless of any process or temperature variations in the components of amplifier 12.

In sum, reference circuit 20 provides an estimate $V_{REF}$ of the common mode output voltage $V_{CM}$ of amplifier 14 as feedback telling amplifier 28 how to adjust supply voltage $V_D$ so the common mode output voltage $V_{CM}$ of amplifier 14 will match $V_{CONT}$.

Scaling to Reduce Power Consumption

The amount of power consumed by control unit 16 can be reduced by appropriately scaling resistor R4, transistor Q3 and current source I3. If we make resistor R4 K times larger than $R_L$, provide a current source I3 supplying a current of magnitude $I_L/K$ and provide a transistor Q3 having an emitter length 1/K times that of transistors Q1 and Q2, reference circuit 20 will generate the same magnitude $V_{REF}$, so that the common mode output voltage $V_{CM}$, of amplifier 14 will substantially match $V_{CONT}$. However the power consumption of reference circuit 20 will be reduced by a factor of K. Thus it is not necessary for transistor Q3, resistor R4 and current source I3 to be identical to transistor Q1, current source I1 and resistor R1; it is merely necessary for transistor Q3, current source I3 and resistor R4 to be appropriately scaled in relation to transistor Q1, current source I1, resistor R1 to produce a reference voltage $V_{REF}$ that is an accurate estimate of the common mode output voltage $V_{CM}$ of amplifier 14.

Differential Amplifier Having Cascode Stage

FIG. 3 illustrates in schematic diagram form a differential amplifier 32 in accordance with the invention including a conventional differential amplifier 34 similar to amplifier 14 of FIG. 2 to which has been added a differential cascode stage consisting of a matching pair of transistors Q4 and Q5 inserted between output terminals 21 and 22 and the collectors of transistors Q1 and Q2. A control unit 36 appropriately adjusts the supply voltage $V_D$ input to amplifier 34 so that the common mode output voltage of amplifier 34 matches a $V_{CONT}$ control voltage input to the control unit. Control unit 36 is generally similar to control unit 16 of FIG. 2 except that a transistor Q6, biased by the same bias voltage $V_{BIAS}$ as transistors Q4 and Q5, is inserted between node 26 and the collector of transistor Q3. The transistor Q6 is similar to transistors Q4 and Q5 and has an emitter length scaled by the same factor 1/K as that of transistor Q3. Thus transistor Q6 affects the estimated common mode output voltage at node 26 in the same way that transistors Q4 and Q5 affect the actual common mode output voltage of amplifier 34.

Y-connected Base stage

FIG. 4 illustrates in schematic diagram form a differential amplifier 42 in accordance with the invention that is similar to amplifier 32 of FIG. 3 except that resistor R3 and current sources I1 and I2 of amplifier 32 are replaced in amplifier 42 with a pair of resistors R5 and R6 coupled to emitters of transistors Q1 and Q2 and a single current source I5 connected between ground and resistors R5 and R6. The control unit 46 of amplifier 42 is similar to the control unit 36 of amplifier 32 except that when R4 is scaled to be K times larger than R1 and R2, and transistor Q3 and Q6 are scaled to have emitter lengths 1/K times that of transistor Q1 and Q4, respectively, and the current source I3 of control unit 46 is scaled to supply a current equal to $I_L/2K$ where $I_L$ is the load current drawn by current source I5.

Thus has been shown and described differential amplifiers in accordance with the invention, each having a common mode output voltage that can be accurately selected by an input control signal irrespective of process and temperature variations. While the forgoing specification has described preferred embodiments of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for adjusting a common mode output voltage of a differential amplifier so that it substantially matches a control voltage, wherein the common mode output voltage is a function of a supply voltage input to the differential amplifier, the method comprising the steps of:

generating a reference voltage in response to the supply voltage wherein the reference voltage substantially matches the common mode output voltage of the differential amplifier, and adjusting the supply voltage so that the reference voltage substantially matches the control voltage.

2. An apparatus for adjusting a common mode output voltage of a differential amplifier so that it substantially matches a control voltage, wherein the common mode output voltage is a function of a supply voltage input to the differential amplifier, the apparatus comprising:

a reference circuit for generating a reference voltage in response to the supply voltage wherein the reference voltage substantially matches the common mode output voltage of the differential amplifier, and means for adjusting the supply voltage so that the reference voltage produced by the reference circuit matches the control voltage.

3. The apparatus in accordance with claim 2 wherein the differential amplifier includes first circuit components that influence the common mode output voltage in response to the supply voltage, and wherein the reference circuit is formed by second circuit components similar to the first circuit components, wherein said second circuit components generate the reference voltage in response to the supply voltage.

4. The apparatus in accordance with claim 2 wherein said means for adjusting the supply voltage comprises an operational amplifier receiving said control voltage and said reference voltage as inputs and producing said supply voltage as output.

5. An apparatus for amplifying a differential input signal to produce a differential output signal having a common mode output voltage substantially matching a control voltage supplied as input to the differential amplifier, the apparatus comprising:

a supply node;

a first input terminal;

a second input terminal, wherein the differential input signal is applied across the first and second input terminal, a first output terminal;

a second output terminal, wherein the differential output signal is produced across the first and second output terminals;

a first transistor having a base coupled to the first input terminal, a collector coupled to the first output terminal, and an emitter;

a second transistor similar to said first transistors, having a base coupled to the second input terminal, a collector coupled to the second output terminal, and an emitter;

a first load resistor coupled between the supply node and the first output terminal;

a second load resistor coupled between the supply node and the second output terminal, wherein said first and second load resistors having substantially matching resistance;

means for supplying a load current to the emitters of said first and second transistors; and a control unit connected to said supply node for generating a reference voltage in response to the supply voltage wherein the reference voltage substantially matches the common mode output voltage of the differential amplifier, and for generating the supply voltage at said supply node of magnitude adjusted such that the reference voltage matches the control voltage.

6. The apparatus in accordance with claim 5 wherein said control unit comprises:

a reference node;

a reference transistor having a base, a collector and an emitter;

means for supplying a bias voltage to the base of the reference transistor;

a reference resistor coupling the reference node to the supply node;

a reference current source supplying reference current to the emitter of said reference transistor, wherein a reference voltage is produced at said reference node; and means receiving the reference voltage and the control voltage for adjusting the supply voltage at said supply node so that said reference voltage substantially matches said control voltage.

7. The apparatus in accordance with claim 6 wherein said reference resistor has a resistance that is K times that of the resistance of the first and second load resistors, wherein K is a number greater than 0, and wherein magnitudes of the reference and load currents are related by the constant K.

8. The apparatus in accordance with claim 7 wherein the reference transistor has an emitter length proportional to an emitter length of the first and second transistors by a constant $1/K$.

9. The apparatus in accordance with claim 6 wherein the means receiving the reference voltage and the control voltage for adjusting the supply voltage at said supply node so that said reference voltage substantially matches said control voltage comprises an operational amplifier receiving said control voltage and said reference voltage as inputs and producing said supply voltage as output.

10. The apparatus in accordance with claim 6 wherein the means for supplying a load current to the emitters of said first and second transistors comprises:

a first current source connected to the emitter of the first transistor;

a second current source connected to the emitter of the second transistors; and a third resistor connected between the emitters of the first and second transistors.

11. The apparatus in accordance with claim 6 wherein the means for supplying a load current to the emitters of said first and second transistors comprises:

a current source;

a third resistor connecting the current source to the emitter of the first transistor; and a fourth resistor connecting the current source to the emitter of the second transistors.

12. An apparatus for amplifying a differential input signal to produce a differential output signal having a common mode output voltage substantially matching a control voltage supplied as input to the differential amplifier, the apparatus comprising:

a supply node;

a first input terminal;

a second input terminal, wherein the differential input signal is applied across the first and second input terminal, a first output terminal;

a second output terminal, wherein the differential output signal is produced across the first and second output terminals;

a first transistor having a base coupled to the first input terminal, a collector, and an emitter;

a second transistor similar to said first transistors, having a base coupled to the second input terminal, a collector, and an emitter;

a third transistor having a base, a collector coupled to the first output terminal, and an emitter coupled to the collector of the first transistor;

a fourth transistor having a base, a collector coupled to the second output terminal, and an emitter coupled to the collector of the second transistor;

a first load resistor coupled between the supply node and the first output terminal;

a second load resistor coupled between the supply node and the second output terminal, wherein said first and second load resistors having substantially matching resistance;

means for supplying a load current to the emitters of said first and second transistors; and a control unit connected to said supply node for generating a reference voltage in response to the supply voltage wherein the reference voltage substantially matches the common mode output voltage of the differential amplifier, and for generating the supply voltage at said supply node of magnitude adjusted such that the reference voltage matches the control voltage.

13. The apparatus in accordance with claim 12 wherein said control unit comprises:

a reference node;

a first reference transistor having a base, a collector and an emitter;

a second reference transistor having a base, a collector connected to the reference node, and an emitter coupled to the collector of the first reference transistor;

means for supplying a first bias voltage to the base of the reference transistor;

means for supplying a second bias voltage to the base of the second reference transistor and to the bases of the third and fourth transistors;

a reference resistor coupling the reference node to the supply node;

a reference current source supplying reference current to the emitter of the first reference transistor, such that a reference voltage is produced at said reference node; and means receiving the reference voltage and the control voltage for adjusting the supply voltage at said supply node so that said reference voltage substantially matches said control voltage.

14. The apparatus in accordance with claim 13 wherein said reference resistor has a resistance that is K times that of the resistance of the first and second load resistors, wherein K is a number greater than 0, and wherein magnitudes of the reference and load currents are related by the constant K.

15. The apparatus in accordance with claim 14 wherein the first reference transistor has an emitter length proportional to an emitter length of the first and second transistors by a constant 1/K; and wherein the second reference transistor has an emitter length proportional to an emitter length of the third and fourth transistors by the constant 1/K.

16. The apparatus in accordance with claim 14 wherein the means receiving the reference voltage and the control voltage for adjusting the supply voltage at said supply node so that said reference voltage substantially matches said control voltage comprises an operational amplifier receiving said control voltage and said reference voltage as inputs and producing said supply voltage as output.

17. An apparatus for generating a differential output voltage in response to a differential input voltage with a common mode output voltage determined in accordance with an input control voltage, the apparatus comprising:

a differential amplifier for generating the differential output voltage in response to the differential input voltage with a common mode output voltage determined in accordance with an input supply voltage, a reference circuit for generating a reference voltage in response to the supply voltage wherein the reference voltage substantially matches the common mode output voltage of the differential amplifier, and means for adjusting the supply voltage so that the reference voltage produced by the reference circuit matches the control voltage.

18. The apparatus in accordance with claim 17 wherein the differential amplifier includes first circuit components that influence the common mode output voltage in response to the supply voltage, and wherein the reference circuit is formed by second circuit components similar to the first circuit components, wherein said second circuit components generate the reference voltage in response to the supply voltage.

19. The apparatus in accordance with claim 17 wherein said means for adjusting the supply voltage comprises an operational amplifier receiving said control voltage and said reference voltage as inputs and producing said supply voltage as output.

* * * * *